United States Patent
Allgaier et al.

(10) Patent No.: US 10,298,234 B2
(45) Date of Patent: May 21, 2019

(54) FIELD DEVICE WITH AN INPUT UNIT

(71) Applicant: VEGA GRIESHABER KG, Wolfach (DE)

(72) Inventors: Volker Allgaier, Haslach (DE); Josef Fehrenbach, Haslach (DE); Holger Staiger, Hardt (DE); Jörg Börsig, Schapbach (DE)

(73) Assignee: VEGA GRIESHABER, Wolfach (DE)

( * ) Notice: Subject to any disclaimer, the term of this patent is extended or adjusted under 35 U.S.C. 154(b) by 0 days.

(21) Appl. No.: 15/318,705

(22) PCT Filed: Jul. 16, 2014

(86) PCT No.: PCT/EP2014/065317
§ 371 (c)(1),
(2) Date: Dec. 14, 2016

(87) PCT Pub. No.: WO2016/008527
PCT Pub. Date: Jan. 21, 2016

(65) Prior Publication Data
US 2017/0134025 A1     May 11, 2017

(51) Int. Cl.
*H03K 17/972*     (2006.01)
*H01H 9/04*       (2006.01)
*G06F 3/02*       (2006.01)
*H01H 13/86*      (2006.01)

(52) U.S. Cl.
CPC .......... *H03K 17/972* (2013.01); *G06F 3/0202* (2013.01); *H01H 9/042* (2013.01); *H01H 13/86* (2013.01); *H03K 2217/9658* (2013.01)

(58) Field of Classification Search
CPC .......... H03K 17/972; H03K 2217/9658; G06F 3/0202
See application file for complete search history.

(56) References Cited

U.S. PATENT DOCUMENTS

| 3,641,568 | A | * | 2/1972 | Brescia | G06C 7/02 |
| | | | | | 178/17 C |
| 5,691,513 | A | * | 11/1997 | Yamamoto | G06F 3/046 |
| | | | | | 178/18.07 |
| 2007/0139359 | A1 | * | 6/2007 | Voelckers | G06F 3/0234 |
| | | | | | 345/156 |

(Continued)

FOREIGN PATENT DOCUMENTS

| DE | 37 34 494 A1 | 5/1988 |
| DE | 10 2011 004007 A1 | 8/2012 |

OTHER PUBLICATIONS

International Search Report for related application PCT/EP2014/065317, dated Apr. 23, 2015.

*Primary Examiner* — Sahlu Okebato
(74) *Attorney, Agent, or Firm* — William Gray Mitchell

(57) ABSTRACT

The invention is a field device with an input unit comprising a first number of switch elements in order to generate first input signals and a second number of magnetically actuatable sensor elements assigned to the switch elements in order to generate second input signals which are OR-linked to the first input signals. Each switch element is assigned to at least two sensor elements, which are arranged and connected such that the respective second input signal is output only when at least two specified sensor elements assigned to a switch element are activated.

10 Claims, 3 Drawing Sheets

(56) References Cited

U.S. PATENT DOCUMENTS

2007/0229468 A1* 10/2007 Peng .................. G06F 3/044
                                                    345/173
2009/0195418 A1*  8/2009 Oh ................... G06F 1/1624
                                                    341/34

* cited by examiner

10,298,234 B2

FIELD DEVICE WITH AN INPUT UNIT

CROSS REFERENCE TO RELATED APPLICATIONS

This patent application claims priority to International Patent Application PCT/EP2014/065317, filed on Jul. 16, 2014.

STATEMENT REGARDING FEDERALLY SPONSORED RESEARCH OR DEVELOPMENT

No federal government funds were used in researching or developing this invention.

NAMES OF PARTIES TO A JOINT RESEARCH AGREEMENT

Not applicable.

SEQUENCE LISTING INCLUDED AND INCORPORATED BY REFERENCE HEREIN

Not applicable.

BACKGROUND

Field of the Invention

The invention relates to field device with an input unit.

Background of the Invention

The present invention is a field device with an input unit, with the input unit comprising a first number of switch elements to generate first input signals and a second number of sensor elements, allocated to the switch elements and allowing magnetic actuation, to generate second input signals, with the second input signals being OR-linked to the first input signals.

Such field devices with input units are known from prior art, for example from DE 37 34 494, which describes a control device secured against explosion, in which one group of data input/scanning sites is allocated to a group of sensors that are aligned to the scanning sites and can be magnetically actuated. In this arrangement known from prior art one input key is respectively allocated to a magnetically actuated sensor and placed directly underneath it. When it is now necessary to enter data at an input unit arranged at the control device, which is arranged in a housing secured against explosion, this can occur via a permanent magnet using its magnetically operating sensors, which can be actuated. In this arrangement known from prior art it is relevant that the keys and the sensors allocated to the keys show a minimum distance, which is selected such that it is not shorter than the interfering distance of the sensors. The interfering distance is understood in the present application as the distance between two sensors at which any differentiation of entries made to these two sensors cannot be clearly distinguished.

Alternative options for actuating input units of field devices of prior art include, for example, a capacitive input, such as the ones used for modern smartphones and tablet PCs or the scanning of a field for infrared radiation. Capacitive inputs are however very limited at the distance, at which actuation occurs, and the scanning of fields for infrared radiation is very expensive with regards to calculation in embedded systems, as typically used in field devices. Both systems cannot be used here, or only to a limited extent. Furthermore, systems operating with infrared radiation are very susceptible to malfunction due to soiling.

FIG. 3 shows an input unit 1 for a field device known from prior art. The input unit 1 comprises four switch elements $S_1$ to $S_4$ arranged in a gap, with respectively a sensor element $H_1$ to $H_4$ being allocated thereto. The switch elements $S_1$ to $S_4$ and the allocated sensor elements $H_1$ to $H_4$ are electrically switched parallel such that respectively by actuating a switch element $S_1$ to $S_4$ or a sensor element $H_1$ to $H_4$ allocated to the switch element an input signal $E_1$ to $E_4$ can be issued. For example the first switch element $S_1$ and the first sensor element $H_1$ are switched parallel such that both an actuation of the first switch element $S_1$ embodied as a sensor as well as an excitation of the first sensor element $H_1$, embodied as a first Hall sensor, is possible generating the first input signal $E_1$. For reasons of simplification, technically necessary pull-up resistors are not shown for the input signals $E_1$ to $E_4$. However they are functionally required and will be provided accordingly by one trained in the art.

The objective of the present invention is to improve a field device with an input unit such that a higher precision of input is yielded and a further miniaturization of the input unit is possible.

This objective is attained in a field device with the features disclosed herein below.

BRIEF SUMMARY OF THE INVENTION

In a preferred embodiment, a field device with an input unit (1) comprising a first total of switch elements ($S_1$ to $S_4$, $S_1$ to $S_8$) to generate first input signals ($E_{11}$ to $E_{14}$) and a second total of sensor elements ($H_1$ to $H_5$) allocated to the switch elements ($S_1$ to $S_4$; $S_1$ to $S_8$) and magnetically actuated, to generate second input signals ($E_{21}$ to $E_{24}$), which are OR-linked to the first input signals ($E_{11}$ to $E_{14}$), with at least two sensor elements ($H_1$ to $H_5$; $H_{11}$ to $H_{32}$) being allocated to each switch element ($S_1$ to $S_4$; $S_1$ to $S_8$), which are arranged and switched such that an output of the respectively second input signal ($E_{21}$ to $E_{24}$) occurs only if at least two predetermined sensor elements ($H_1$ to $H_5$; $H_{11}$ to $H_{32}$) allocated to a switch element ($S_1$) are actuated.

In another preferred embodiment, the field device as disclosed herein, wherein the switch elements ($S_1$ to $S_4$; $S_1$ to $S_8$) and the sensor elements ($H_1$ to $H_4$; $H_{11}$ to $H_{32}$) show a regular arrangement.

In another preferred embodiment, the field device as disclosed herein, wherein the switch elements ($S_1$ to $S_4$; $S_1$ to $S_8$) and the sensor elements ($H_1$ to $H_5$; $H_{11}$ to $H_{32}$) are arranged in lines (L) and/or columns (C).

In another preferred embodiment, the field device as disclosed herein, wherein respectively one switch element ($S_1$ to $S_4$; $S_1$ to $S_8$) is arranged between at least two sensor elements ($H_1$ to $H_5$; $H_{12}$ to $H_{32}$) allocated thereto.

In another preferred embodiment, the field device as disclosed herein, wherein per line (L) and/or column (C) respectively n switch elements ($S_1$ to $S_4$; $S_1$ to $S_8$) and n+1 sensor elements ($H_1$ to $H_5$; $H_{11}$ to $H_{32}$) are arranged.

In another preferred embodiment, the field device as disclosed herein, wherein the sensor elements ($H_1$ to $H_5$; $H_{11}$ to $H_{32}$) are embodied as Hall sensors.

In another preferred embodiment, the field device as disclosed herein, wherein the switch elements ($S_1$ to $S_4$; $S_1$ to $S_8$) are embodied as keys, particularly as keypads.

In another preferred embodiment, the field device as disclosed herein, wherein the input unit (1) is arranged in a housing that is protected from explosion.

In another preferred embodiment, the field device as disclosed herein, wherein a corresponding lettering is allocated to the switch elements ($S_1$ to $S_4$; $S_1$ to $S_8$).

In another preferred embodiment, the field device as disclosed herein, wherein at least one display means is allocated to the switch elements ($S_1$ to $S_4$; $S_1$ to $S_8$) and the corresponding sensor elements ($H_1$ to $H_5$: $H_{11}$ to $H_{32}$), which indicates the actuation of the switch element ($S_1$ to $S_4$; $S_1$ to and/or the corresponding sensor elements ($H_1$ to $H_4$; $H_{11}$ to $H_{32}$).

DETAILED DESCRIPTION OF THE INVENTION

Figure 1:
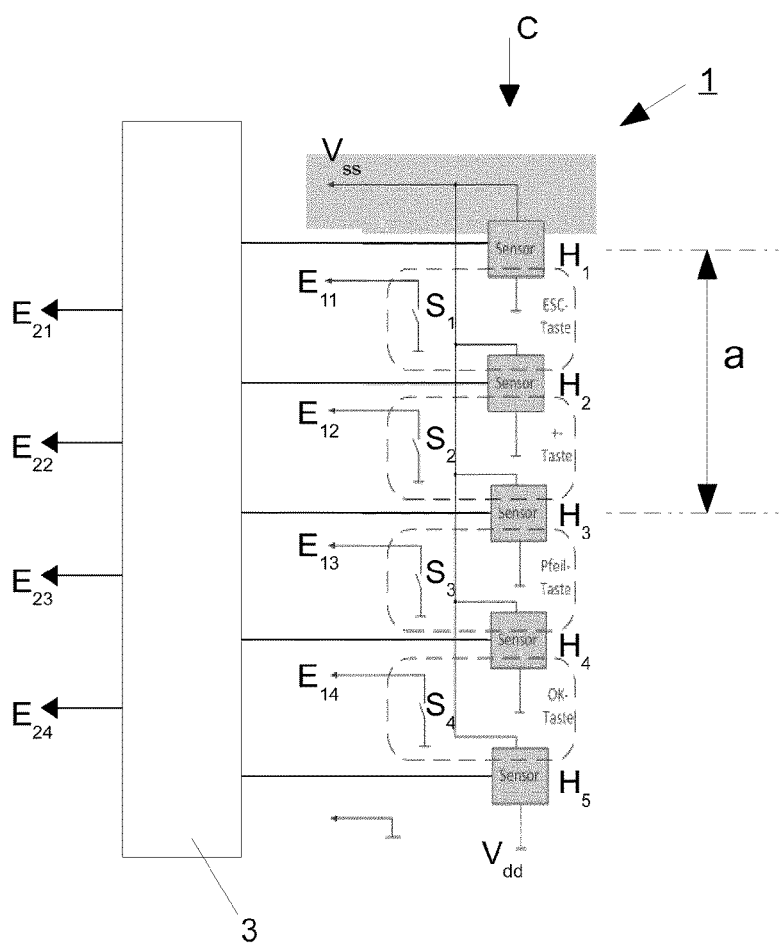
FIG. 1 is a line drawing evidencing a first exemplary embodiment of an input unit with switch elements and sensor elements arranged in a column.

A field device according to the invention, comprising an input unit comprising a first number of switch elements for generating first input signals and a second number of switch elements allocated thereto, preferably spatially arranged and magnetically actuated sensor elements for generating second input signals, which are OR-linked to the first input signals, is characterized in that at least two sensor elements are allocated to each switch element, which are arranged and switched such that an output of the respective second input signal occurs only if at least two or more predetermined sensor elements are actuated, which are allocated to a switch element.

By allocating at least two sensor elements to one switch element, it can be achieved that the combined interference distance of these two sensor elements allocated to the switch element is considerably reduced in reference to a 1:1 allocation as known from prior art and thus a further miniaturization is possible, i.e. particularly a reduction of a distance between two switch elements. In the present configuration it is particularly decisive that any actuation via a magnetic input device, for example a permanent magnet, can be designed in a more intuitive fashion, so that the actuation can occur at the same points as a manual operation via the switch elements, which, for example, may be embodied as a mechanic key.

Therefore it can be waived that different control keys have to be provided for the two different input variants.

Preferably, the two switch elements and the sensor elements show a regular arrangement, with the switch elements and the sensor elements allowing, for example, an arrangement in lines and/or columns. By a regular arrangement of the switch elements and the sensor elements, here an allocation of sensor elements to switch elements is possible in a particularly easy fashion and additionally a multiple use of individual sensor elements can occur for example for two adjacently arranged switch elements. For this purpose preferably for the switch elements arranged in lines here sensor elements are also provided arranged in lines, with one switch element respectively being arranged between two sensor elements. Preferably, for this purpose n+1-sensor elements are arranged in a line with n-switch elements, with one line being formed by an alternating arrangement of sensor elements and switch elements. The present invention can also be applied to an arrangement in columns and/or switch elements arranged in a matrix and appropriately allocated sensor elements.

Such an arrangement allows that in the arrangement of switch elements in a line respectively two sensor elements, allocated to the switch element and arranged adjacent thereto, have to be actuated in order to issue the respectively second input signal.

For this purpose the sensors can be embodied as Hall sensors, for example, with other sensors also being suitable for the detection of magnetic fields.

Keys are common embodiments of the switch elements, with particularly keypads being used, here.

The present invention is particularly advantageous if at least one input unit is arranged in a housing protected from explosion, because frequently in this application the advantages of magnetically actuated sensor elements are particularly prominent in reference to other touchless input options.

In particular, the option must be emphasized to perform actuation over larger distances, particularly a distance from 2 mm to 15 mm.

As already indicated, it is particularly advantageous for a switch element to be allocated to a corresponding lettering, which also applies to the second input signals, which are issued by actuating the magnetically operable sensor elements.

One display means each may be allocated to the switch elements and the corresponding sensor elements, which indicates the switch elements and/or the sensor elements allocated thereto. Such a display element may represent a light diode, for example, which indicates an actuation of the shaft elements and/or the corresponding sensor elements when an appropriate input signal is issued.

This embodiment is advantageous in that here user-friendly operation can be generated, that a single user interface can be used which marks the individual switch elements also for the selection of sensor elements $H_1$ to $H_4$.

Furthermore, the display means corrects the lack of tactile feedback when operating via sensor elements. In keypads a tactile feedback is provided for example via a clicker, i.e. a tactile acting mechanic feedback device of the sensor. When using sensor elements the user is only provided with feedback via the display. This may be delayed in low-capacity devices. A rapid feedback if a key has been actuated is provided to the user via the display means, which for example may be a LED.

As already shown, it is however disadvantageous in arrangements of prior art that with increasing miniaturization of field devices and thus miniaturization of the input device 1, here a reduction of the distance a between the switch elements $S_1$ and $S_4$ and thus also between the sensor elements $H_1$ to $H_4$ is necessary. In such a reduction of the distance however the interference distance required between the sensor elements $H_1$ to $H_4$ cannot be maintained any longer so that an unambiguous operation, i.e. an unambiguous generation of a certain input signal $E_1$ to $E_4$ is no longer possible via the sensor elements $H_1$ to $H_4$.

DETAILED DESCRIPTION OF THE FIGURES

FIG. 1 shows a first exemplary embodiment of an input unit 1 according to the invention, with in the exemplary embodiment shown a total of four switch elements $S_1$ to $S_4$ are arranged in a column C. The positions of the switch elements $S_1$ to $S_4$, in the present case embodied as mechanic keys, also represent the position of keys allocated to the switch elements $S_1$ to $S_4$, which are shown schematically in FIG. 1. The switch elements $S_1$ to $S_4$ respectively issue first input signals $E_{11}$ to $E_{14}$ upon actuation thereof. Additionally, sensor elements $H_1$ to $H_5$ are arranged in the column C, with one switch element $S_1$ to $S_4$ each being arranged respectively between two sensor elements $H_1$ to $H_5$. For example, a first switch element $S_1$ is arranged between a first sensor element $H_1$ and a second sensor element $H_2$. A second switch element $S_2$ is respectively arranged between the second sensor element $H_2$ and a third sensor element $H_3$, etc. In order to now generate the desired redundancy in operation, i.e. either a manual operation via the switch elements $S_1$ to $S_4$ or an operation via a magnetic input device, for example a permanent magnet and the sensor elements $H_1$ to $H_5$ and to yield respective second input signals $E_{21}$ to $E_{24}$ when actuation occurs via the input device, the sensor elements $H_1$ to $H_5$ are connected to each other such that a respective second input signal can only be issued upon an actuation of both sensor elements $H_1$ to $H_5$ allocated to a switch element $S_1$ to $S_4$.

For example, the second input signal $E_{21}$, which corresponds only to the first input signal $E_{11}$ of the first switch element $S_1$, is only issued if the first sensor element $H_1$ and the second sensor element $H_2$ are both actuated. Due to the fact that an actuation of both sensor elements $H_1$ and $H_2$ is required here the interference distance between the sensor elements allocated to the respective switch elements is no longer the distance between two adjacent sensor elements $H_1$, $H_2$ but the relevant distance from the respectively second to next sensor element is relevant, here. This way another miniaturization of the input unit 1 can occur, and simultaneously improved detection can be yielded when actuating via a permanent magnet.

A logic unit 3 is provided for issuing the second input signals and/or the connection of the sensor elements $H_1$ to $H_5$.

The exemplary embodiment shown in FIG. 1 can of course be embodied with more or fewer switch elements and more or fewer sensor elements. In this case a total of n-switch elements in a column C are always allocated to a second total of at least n+1 sensor elements.

Figure 2:
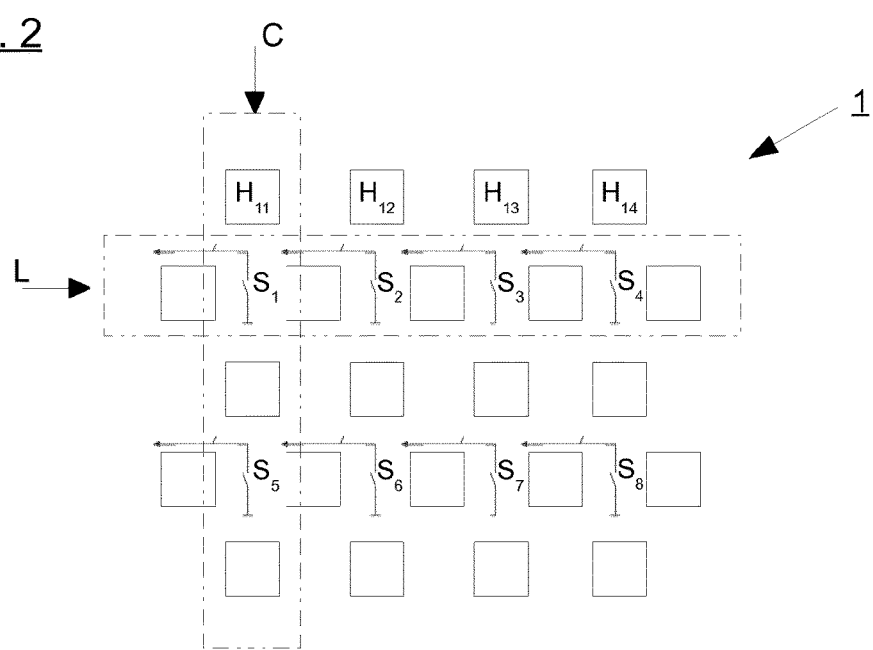
FIG. 2 is a line drawing evidencing a second exemplary embodiment of an input unit with switch elements and sensor elements arranged in a matrix.
Figure 3:
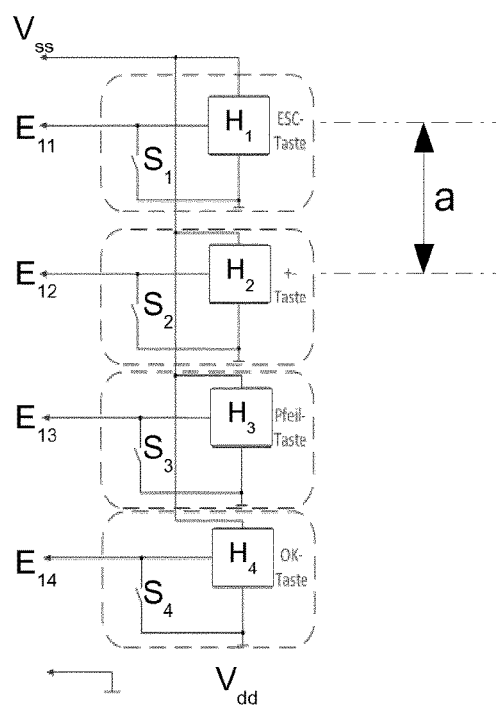
FIG. 3 is a line drawing evidencing an input unit according to prior art.

FIG. 2 shows another exemplary embodiment of an input unit 1, with in the exemplary embodiment shown in FIG. 2 the switch elements S are arranged in four columns and two lines in a matrix. In order to yield optimal miniaturization this embodiment it is advantageous if in every column C with n-switch elements, in the present case two of them, n+1 sensor elements are provided, in the present case three sensor elements. Accordingly, in every line L with n-switch elements, in the present case four of them, n+1 sensor elements are provided, in the present case five of them.

In the present exemplary embodiment here a matrix-like arrangement results, showing a total of eight switch elements, with 22 sensor elements being allocated thereto.

The number of required sensor elements can be optimized depending on the embodiment by a clever arrangement of the sensor elements in reference to the switch elements, with still at least two sensor elements remaining allocated to the switch element.

LIST OF REFERENCE NUMBERS 1 input unit
2 logic unit
$S_1$ to $S_4$ switch elements
$H_1$ to $H_4$ sensor elements
$E_{11}$ to $E_{14}$ first input signals
$E_{21}$ to $E_{24}$ second input signals
L lines
C columns The references recited herein are incorporated herein in their entirety, particularly as they relate to teaching the level of ordinary skill in this art and for any disclosure necessary for the commoner understanding of the subject matter of the claimed invention. It will be clear to a person of ordinary skill in the art that the above embodiments may be altered or that insubstantial changes may be made without departing from the scope of the invention. Accordingly, the scope of the invention is determined by the scope of the following claims and their equitable equivalents.

We claim:

1. A field device with an input unit comprising a first set of switch elements embodied as mechanical keys to generate first input signals and a second set of sensor elements allocated to the switch elements and magnetically actuated, to generate second input signals, wherein the second input signals are OR-linked only to the first input signals, wherein at least two sensor elements are allocated to each switch element, which switch elements are each arranged and switched such that an output of the respectively second input signal occurs only when at least two predetermined sensor elements allocated to a switch element are actuated, wherein one switch element is arranged between at least two sensor elements allocated thereto and wherein, respectively, n switch elements and n+1 sensor elements are arranged per line and column.

2. The field device according to claim 1, wherein the switch elements and the sensor elements show a regular arrangement.

3. The field device according to claim 2, wherein the switch elements and the sensor elements are arranged in lines and columns.

4. The field device according to claim 1, wherein the sensor elements are embodied as Hall sensors.

5. The field device according to claim 1, wherein the switch elements are embodied as keys, particularly as keypads.

6. The field device according to claim 1, wherein the input unit is arranged in a housing that is protected from explosion.

7. The field device according to claim 1, further comprising wherein a corresponding lettering is allocated to the switch elements.

8. The field device according to claim 1, further comprising wherein at least one display means is allocated to the switch elements and the corresponding sensor elements, which indicates the actuation of the switch element and the corresponding sensor elements.

9. The field device according to claim 1, further comprising a logic unit for issuing the second input signals and for connecting the sensor elements.

10. The field device according to claim 3, wherein one line is formed by an arrangement of sensor elements and a second line is formed by an arrangement switch elements, wherein one more sensor element is provided than switch element, the sensor elements and switch elements.

* * * * *